United States Patent [19]
Niimi et al.
[11] Patent Number: 4,803,731
[45] Date of Patent: Feb. 7, 1989

[54] REVERBATION IMPARTING DEVICE

[75] Inventors: Koji Niimi; Yuji Kakubo; Yuji Ikegaya, all of Hamamatsu, Japan
[73] Assignee: Yamaha Corporation, Hamamatsu, Japan

[21] Appl. No.: 89,907
[22] Filed: Aug. 24, 1987

Related U.S. Application Data

[63] Continuation of Ser. No. 643,076, Aug. 22, 1984, abandoned.

[30] Foreign Application Priority Data

| | | | |
|---|---|---|---|
| Aug. 31, 1983 | [JP] | Japan | 58-161065 |
| Aug. 31, 1983 | [JP] | Japan | 58-161066 |
| Aug. 31, 1983 | [JP] | Japan | 58-161067 |

[51] Int. Cl.[4] H03G 3/00
[52] U.S. Cl. 381/63; 84/DIG. 26
[58] Field of Search 381/62, 63; 84/DIG. 26, 84/1.25, DIG. 4

[56] References Cited

U.S. PATENT DOCUMENTS

| | | | |
|---|---|---|---|
| 4,184,047 | 1/1980 | Langford | 381/63 |
| 4,215,242 | 7/1980 | Gross | 381/63 |
| 4,237,343 | 12/1980 | Kurtin et al. | 381/63 |
| 4,389,915 | 6/1983 | Bione | 381/63 |
| 4,472,993 | 9/1984 | Futamase et al. | 381/63 |
| 4,489,439 | 12/1984 | Scholz et al. | 381/17 |
| 4,602,133 | 7/1986 | O'Neill | 370/32.1 |

OTHER PUBLICATIONS

Chamberlin, Musical Applications of Microprocessors, 1980, p. 462.

Araseki et al., "A Microprocessor Echo Canceller" (Fourth International Conference on Digital Satellite Communications, Montreal, Canada, 23–25 (1978).

*Primary Examiner*—Forester W. Isen
*Attorney, Agent, or Firm*—Spensley, Horn, Jubas & Lubitz

[57] ABSTRACT

A reverberation imparting device comprises a delay memory storing input signal data at a predetermined sampling period and producing a delay signal corresponding to time interval between writing of the input signal data and reading thereof, a plurality of address each adding delay signals read out from the delay memory, and an output section for delivering out an output of each of the adders as a reverberation signal. The delay signals are divided into groups and processed on the group basis. This simplifies the construction of the device and facilitates setting and changing of the reverberation characteristics.

12 Claims, 15 Drawing Sheets

| (ADDRESS) | (ADDRESS DATA) | (GAIN DATA) |
|---|---|---|
| 0 | 0 | 0 |
| 1 | $\tau_1/\tau_0$ | $g_1$ |
| 2 | $\tau_2/\tau_0$ | $g_2$ |
| ⋮ | ⋮ | ⋮ |
| | $\tau_a/\tau_0$ | $g_a$ |
| | $\alpha$ | 0 |
| | $\tau_{a+1}/\tau_0$ | $g_{a+1}$ |
| | $\tau_{a+2}/\tau_0$ | $g_{a+2}$ |
| | ⋮ | ⋮ |
| | $\tau_b/\tau_0$ | $g_b$ |
| | $\beta$ | 0 |
| | $\tau_{b+1}/\tau_0$ | $g_{b+1}$ |
| | $\tau_{b+2}/\tau_0$ | $g_{b+2}$ |
| | ⋮ | ⋮ |
| | $\tau_n/\tau_0$ | $g_n$ |
| | $\gamma$ | 0 |
| | X | $B_1$ |
| | Y | $B_2$ |
| | Z | $B_3$ |
| | $\alpha$ | $A_1$ |
| | $\beta$ | $A_2$ |
| | $\gamma$ | $A_3$ |

REVERBATION IMPARTING DEVICE

This is a continuation of copending application Ser. No. 643,076 filed on Aug. 22, 1984, now abandoned.

FIELD OF THE INVENTION

This invention relates to a device for artificially imparting reverberation to a signal such as a musical tone signal and, more particularly, to a device which employs a memory for producing delay signals based on time interval between writing and reading of a signal and produces a reverberation signal by superposing (i.e., performing convolution operation) delay signals read out from this memory on the basis of input signal data which is successively written into the memory. The device has a simplified construction owing to processing of the delay signals on the group basis.

BACKGROUND OF THE INVENTION

For artificially imparting reverberation to a musical tone signal, the most direct method employing an electronic technique is to produce reverberation by superposing signals which have various lengths of time delay relative to the direct sound in accordance with the impulse response in a room in which the reverberation is assumed to occur. According to this method, desired reverberation is produced, as shown in FIG. 1(a), by providing delay signals from a delay memory 1 having plural taps and synthesizing these delay signals by an adder 3 through amplitude adjusters 2-1, 2-2, . . . , 2-n. In the device shown in FIG. 1(a), a reverberation signal is obtained as an output signal Xout which is $$Xout = \sum_{i=1}^{n} X_i \cdot g_i$$

Where $X_i$ represents a signal obtained by delaying an input signal Xin by time $\tau_i$ and $g_i$ represents gains of the respective amplitude adjusters 2-1, 2-2, . . . , 2-n, i.e., values of weighting to the respective delay signals $X_i$. An echo time pattern of the device of FIG. 1(a) is shown in FIG. 1(b).

In the art of artificially imparting reverberation, it is often practiced, for obtaining as natural reverberation as possible (e.g., reverberation simulating one in a concert hall), to spatially arrange a plurality of reverberation signals to a single input signal (e.g., a musical tone signal of a single musical instrument), i.e., to sound the musical tone signal from a multichannel system such as a two-channel system and a four-channel system. If, however, the two-channel or four-channel system is constructed by simply employing two or four of the devices shown in FIG. 1(a), the size of the device becomes twice or four times as large as the device shown in FIG. 1(a) resulting in a tremendous increase in the manufacturing cost.

There is another problem which concerns a demand for changing the reverberation characteristics depending upon the environment in which the musical tone signal is sounded.

FIG. 2 shows a result of simulation of primary and secondary reflected sounds in a certain actually existing room. There are 11 primary reflected sounds and 24 secondary reflected sounds. If these reflected sounds are simulated by the reverberation imparting device of FIG. 1, a delay memory having 35 taps in all is required. Further, since the respective reflected sounds must be provided with different coefficients, 35 different gain data $g_1$ to $g_{35}$ must be set. This may be tolerable if 35 fixed coefficients only are used. There is, however, a demand for changing reverberation characteristics depending upon the environment such as the size of a concert hall and magnitude of the coefficient of reflection of the wall. If the reverberation characteristics are to be changed specifically according to such specific circumstances, the 35 coefficient parameters $g_1$ to $g_{35}$ must be set again independently. This involves a quite cumbersome operation and therefore is unrealistic.

SUMMARY OF THE INVENTION

It is, therefore, an object of the present invention to provide a reverberation imparting device capable of dividing delay signals into groups and processing the delay signals on the group basis. This enables a single memory to be used commonly for producing reverberation signals of plural channels whereby the construction of the device is simplified.

It is another object of the invention to provide a reverberation imparting device capable of setting and changing coefficients of convolution operation on the group basis in processing delay signals read out from a memory on the group basis. This facilitates setting and changing of the reverberation characteristics.

It is still another object of the invention to provide a reverberation imparting device capable of collectively setting and changing coefficients of the convolution operation for facilitating setting and changing of the reverberation characteristics.

According to the invention, there is provided reverberation imparting device comprising a delay memory storing input signal data at a predetermined sampling period and producing a delay signal based on time interval between writing of the input signal data and reading thereof, a plurality of adders each adding delay signals read out from the delay memory, and an output section for delivering out an output of each of the adders as a reverberation signal.

BRIEF DESCRIPTION OF THE DRAWINGS

In the accompanying drawings.

DESCRIPTION OF PREFERRED EMBODIMENTS

Embodiments of the invention will now be described with reference to the accompanying drawings. As to the construction of the delay memory, a charge transfer device such as a bucket brigade device (BBD) or a charge coupled device (CCD) may be used for an analog signal and a digital memory which is program-controlled, e.g. a shift register or a RAM (random-access memory), may be used for a digital signal. In the embodiments to be described below, description will be made about an example employing a RAM which has a relatively large freedom of construction and allows ready setting and changing of parameters.

Figure 3:
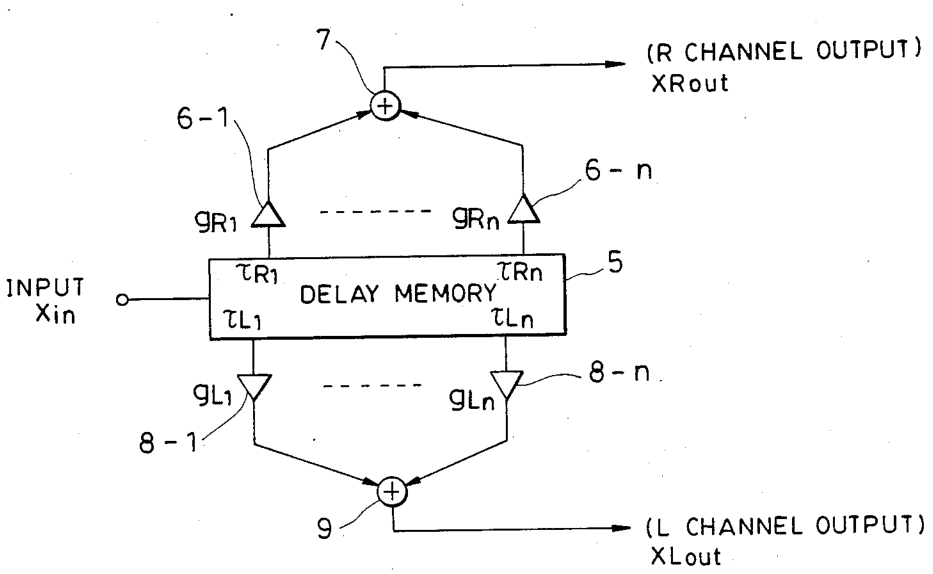
FIG. 3 is a block diagram showing an embodiment of the present invention.

Referring to FIG. 3, a delay memory 5 has 2n taps of delay times $\tau L_1, \tau L_2, \ldots, \tau L_n, \tau R_1, \tau R_2, \ldots, \tau R_n$. In the present embodiment, reverberation signals of two channels, i.e., left and right channels, are to be obtained and the delay times $\tau L_1, \tau L_2, \ldots, \tau L_n$ are used for the left channel and the delay times $\tau R_1, \tau R_2, \ldots, \tau R_n$ for the right channel. Signals $XL_1, XL_2, \ldots, XL_n$ which are obtained by delaying an input signal Xin by the delay times $\tau L_1, \tau L_2, \ldots, \tau L_n$ are weighted by amplitude adjusters 8-1, 8-2, . . . , 8-n whose gains are $gL_1, gL_2, \ldots, gL_n$ and thereafter is synthesized by an adder 9 to produce an output $$XL\text{out} = \sum_{i=1}^{n} XL_i \cdot gL_i \quad (1)$$

Signals $XR_1, XR_2, \ldots, XR_n$ which are obtained by delaying an input signal Xin by the delay times $\tau R_1, \tau R_2, \ldots, \tau R_n$ are weighted by amplitude adjusters 6-1, 6-2, . . . , 6-n whose gains are $gR_1, gR_2, \ldots, gR_n$ and thereafter is synthesized by an adder 7 to produce an output $$XR\text{out} = \sum_{i=1}^{n} XR_i \cdot gR_i \quad (2)$$

The delay times $\tau L_1, \tau L_2, \ldots, \tau L_n, \tau R_1, \tau R_2, \ldots, \tau R_n$ and gains $gL_1, gL_2, \ldots, gL_n, gR_1, gR_2, \ldots, gR_n$ are set on the basis of factors sich as simulation of a room having assumed reverberation characteristics.

According to the above described construction, reverberation signals of two channels can be obtained from a single delay memory so that the device is simpler in construction and therefore is less expensive than a device in which delay memories are provided in the same number as the number of channels.

While the embodiment shown in FIG. 3 illustrates a case where reverberation of two channels are produced, it is possible to produce reverberation signals of more channels from a single delay memory.

A specific example of construction of the reverberation imparting device shown in FIG. 3 will now be described with respect to FIG. 4.

Figure 4:
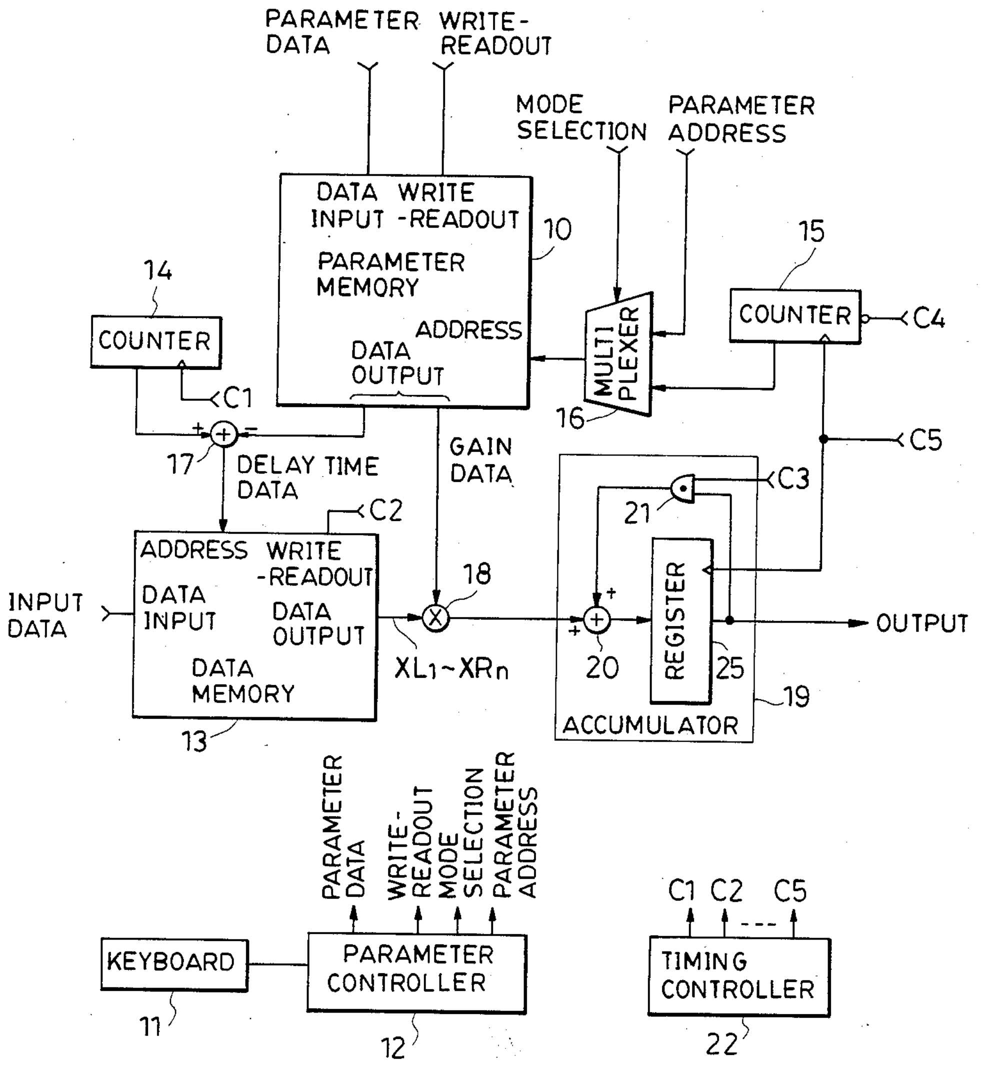
FIG. 4 is a block diagram showing a specific example of the reverberation imparting device of FIG. 3.

In FIG. 4, a parameter memory 10 has 2n+1 addresses of 0 to 2n and stores respective parameters, i.e., delay time data and gain data, at the respective addresses. The parameters stored at the respective addresses are shown in the following Table 1.

TABLE 1

| address | delay time data (integer) | gain data |
|---|---|---|
| 0 | 0 | 0 |
| 1 | $\tau L_1/\tau_0$ | $gL_1$ |
| 2 | $\tau L_2/\tau_0$ | $gL_2$ |
| 3 | $\tau L_3/\tau_0$ | $gL_3$ |
| . | . | . |
| . | . | . |
| . | . | . |
| n | $\tau L_n/\tau_0$ | $gL_n$ |
| n + 1 | $\tau R_1/\tau_0$ | $gR_1$ |
| n + 2 | $\tau R_2/\tau_0$ | $gR_2$ |
| . | . | . |
| . | . | . |
| . | . | . |
| 2n | $\tau R_n/\tau_0$ | $gR_n$ |

In this table, $\tau_0$ indicates one sampling period of an input signal. The delay time data $\tau L_1/\tau_0, \tau L_2/\tau_0, \ldots$ (value in integers) indicate sample positions corresponding to the delay times $\tau L_1, \tau L_2, \ldots$ (i.e., how many samples before).

Writing of parameters into the parameter memory 10 is performed by a parameter controller 12 in response to the operation of a keyboard 11.

A data memory (delay memory) 13 is constructed of a RAM. Digital inputs signals converted from analog signals are successively written into the memory 13 whereas delay data at addresses corresponding to the delay time data $\tau L_1/\tau_0$, $\tau L_2/\tau_0$, . . . stored in the parameter memory 10 is read out from the memory 13.

A counter 14 designates a present address at which writing of the digital signals into the data memory 13 is to be made. The counter 14 is counted up at each sample period.

A counter 15 designates a readout address of the parameter memory 10. The counter 15 is counted up from 0 to 2n during one sample period of an input signal to provide the delay time data and the gain data.

A multiplexer 16 switches an address order to be applied to the parameter memory 10 between a write address from the parameter controller 12 and a readout address from the counter 15.

A subtractor 17 provides difference between the present address from the counter 14 and the delay time data from the parameter memory 10 as an address order for the data memory 13. The data memory 13 is changed into the write mode when the readout address of the parameter memory 10 is 0 (i.e., the read out delay time data and gain data are both 0), and the output of the subtractor 17 at this time (i.e., an output from the counter 14) is applied as the write address to the data memory 13. While, the data memory 13 is changed into the readout mode during time when the readout address of the parameter memory 10 is not 0, and the output of the subtractor 17 (i.e., an address which is away from the present address by a distance corresponding to the delay time data) is applied as the readout address order to the data memory 13.

A multiplier 18 provides a delay signal read out from the data memory 13 with gain data read out from the parameter memory 10.

An accumulator 19 cumulatively adds (performing convolution operation) delay signals provided by the multiplier 18 by a register 25 and an adder 20 to produce reverberation signal shown in the above equations (1) and (2). The reverberation signals thus produced by the accumulator 19 are converted to analog signals and thereafter are delivered out for sounding. An AND gate 21 is provided to interrupt accumulated data by application of a signal C3 each time a reverberation signals has been produced, thereby resetting the accumulated value to 0.

A timing controller 22 is provided for producing timing signals C1 to C5 which are used for operating the above described circuits.

The operation of the device shown in FIG. 4 will now be described.

(1) Setting of parameters

In using this device, the respective parameters, i.e., the delay time data $\tau L_n$ to $\tau R_n$ and the gain data $gL_1$ to $gR_n$, are first set. The setting of the parameters is controlled by the parameter controller 12. That is, the parameter memory 10 is switched to the write mode by the operation of the keyboard 11 and the multiplexer 16 is switched to a setting mode to set these parameters.

(2) Production of reverberation signals

Upon setting of the parameters, the parameter memory 10 is switched to the readout mode and the multiplexer 16 is switched to the side of the counter 15 to supply an input signal to the data memory 13 and prepare reverberation signals.

Figure 5:
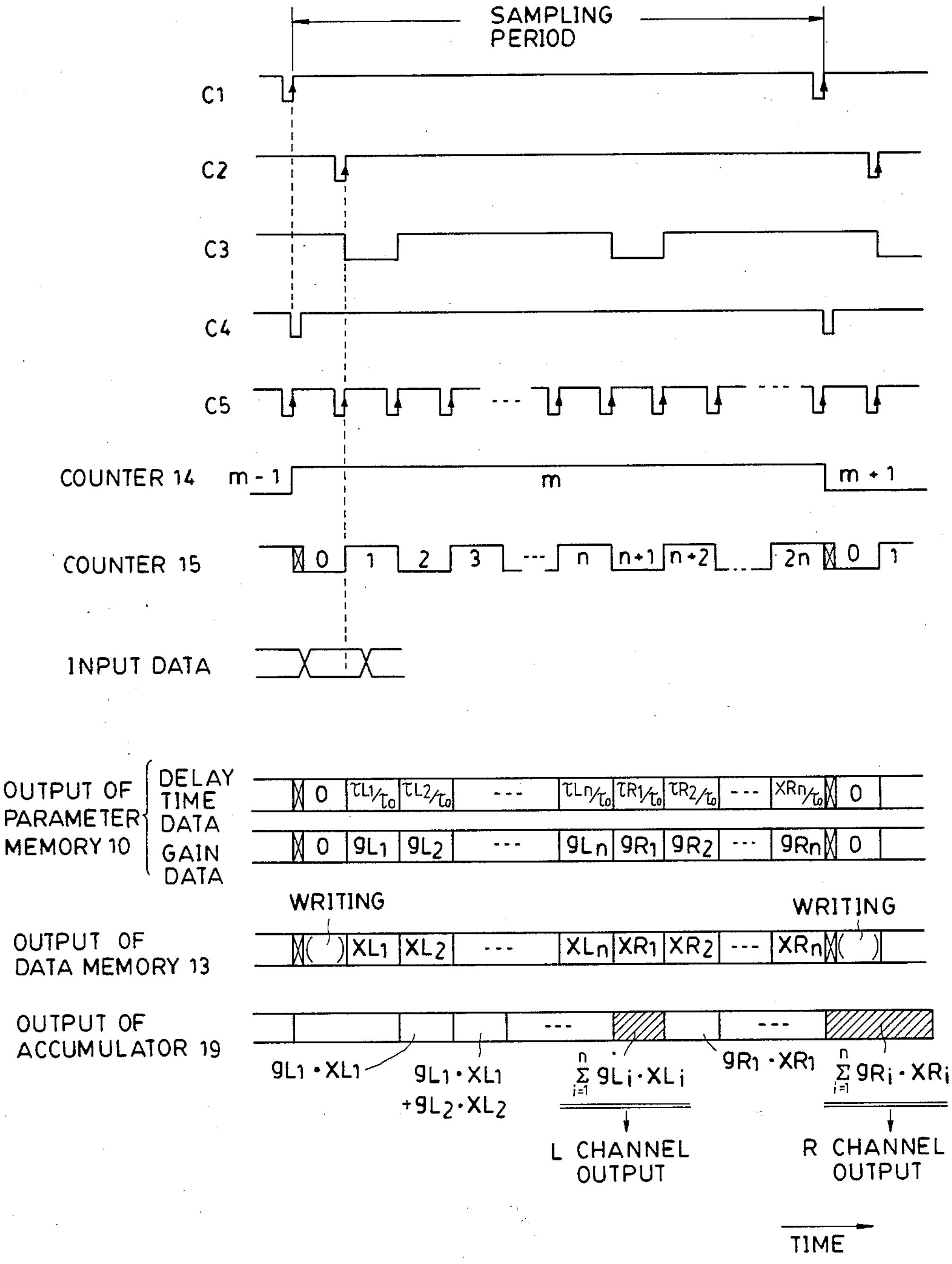
FIG. 5 is a time chart showing the operation of the reverberation imparting device of FIG. 4.

The reverberation signal is produced within one sampling period of an input signal. In one sampling period, processings of 1 writing of an input signal into the data memory 13, 2 reading of delay signals corresponding to the respective set delay times from the data memory 13, 3 weighting of the read-out delay signals and 4 accumulation of the delay signals are performed to produce a reverberation signal. The respective processings will be described with reference to a time chart of FIG. 5.

1 Writing of an input signal into the data memory 13

A clock C4 falls at the rise of a clock C1 thereby clearing the counter 15. Accordingly, the address 0 is designated in the parameter memory 10 so that the read-out delay time data and gain data are both 0. At the rise of a next clock C5, the clock C2 also rises bringing the data memory 13 into the write mode. Since the delay time data from the parameter memory 10 at this time is "0" as described above, the output of the subtractor 17 is the output of the counter 14 itself so that an input signal is written at the address of the data memory 13 indicated by this output of the counter 14.

2 Reading of the delay signal from the data memory 13

Upon completion of the writing into the data memory 13, the data memory 13 is switched to the read out mode. Within one sampling period, clock C5 rises once for the above described writing and 2n times for reading, totalling 2n+1 times. The counter 15 counts this clock C5 and supplies this count to the parameter memory 10 to read out the delay time data and the gain data. Reading of the former n times is performed for production of the left channel reverberation signals and reading of the latter is performed n times for production of the right channel reverberation signals. When, for example, the count of the counter 15 is "1", the delay time data $\tau L_1/\tau_0$ and the gain data $gL_1$ are read out from the address 1 of the parameter memory 10. Subsequently, the data $\tau L_2/\tau_0$ and $gL_2$ are read out from the address 2, . . . , $\tau L_n/\tau_0$ and $gL_n$ from the address n, $\tau R_1/\tau_0$ and $gR_1$ from the address n+1, . . . , and $\tau R_n/\tau_0$ and $gR_n$ from the address 2n successively.

The delay time data read out from the parameter memory 10 is subtracted from the count of the counter 14 in the subtractor 17 and an address before the present address, i.e., the present count of the counter 14, by distance represented by the delay time data is provided by the subtractor 17, whereby the delay signals $XL_1$ to $XR_n$ stored at the corresponding address in the data memory 13 are read out.

3 Weighting

The delay signals read out from the data memory 13 are provided in the multiplier 18 with the corresponding gain data $gL_1$ to $gR_n$ read out from the parameter memory 10.

4 Accumulation

While the count of the counter 15 changes from 1 to n, the left channel reverberation signal is obtained by cumulatively adding the data $gL_1 \bullet XL_1$ to $gL_n \bullet XL_n$ produced from the multiplier 18. Likewise, while the count of the counter 15 changes from n+1 to 2n, the right channel reverberation signal is obtained by cumulatively adding the data $gR_1 \bullet XR_1$ to $gR_n \bullet XR_n$ produced from the multiplier 18. For effecting these accumulations, clock C3 falls and the accumulator 19 is reset when the count of the counter 15 is "1" and "n+1". More specifically, when the count of the counter 15 is "1", the AND gate 21 is turned off and the output of the adder 20 becomes the output $gL_1 \bullet XL_1$ of the multiplier 18 only and held by the register 25. At a timing of a next clock C5, the register 25 outputs the data $gL_1 \bullet XL_1$ which is added in the adder 20 to next data $gL_2 \bullet XL_2$ to rewrite the value of the register 25. The addition is successively repeated in the same manner until a value $$\sum_{i=1}^{n} gL_i \cdot XL_i$$

is obtained by cumulatively adding n terms. This value is delivered out as the left channel reverberation signal.

Then, when the count of the counter 15 is "n+1", clock C3 falls and the accumulated value is reset so that the cumulative addition is effected with a next value $gR_1 \bullet XR_1$ being used as the first term. Upon successively performing the cumulative addition for n terms, a value $$\sum_{i=1}^{n} gR_i \cdot XR_i$$

is delivered out as the right channel reverberation signal.

By the above described operation, reverberation signals of left and right channels can be produced by a single data memory (delay memory) 13 in one sampling period of an input signal.

In the above described embodiment, the single data memory (delay memory) 13 is adapted to produce reverberation signals of two channels. It is possible, however, to obtain reverberation signals of more channels by increasing the rate of the reading clock.

Figure 6:
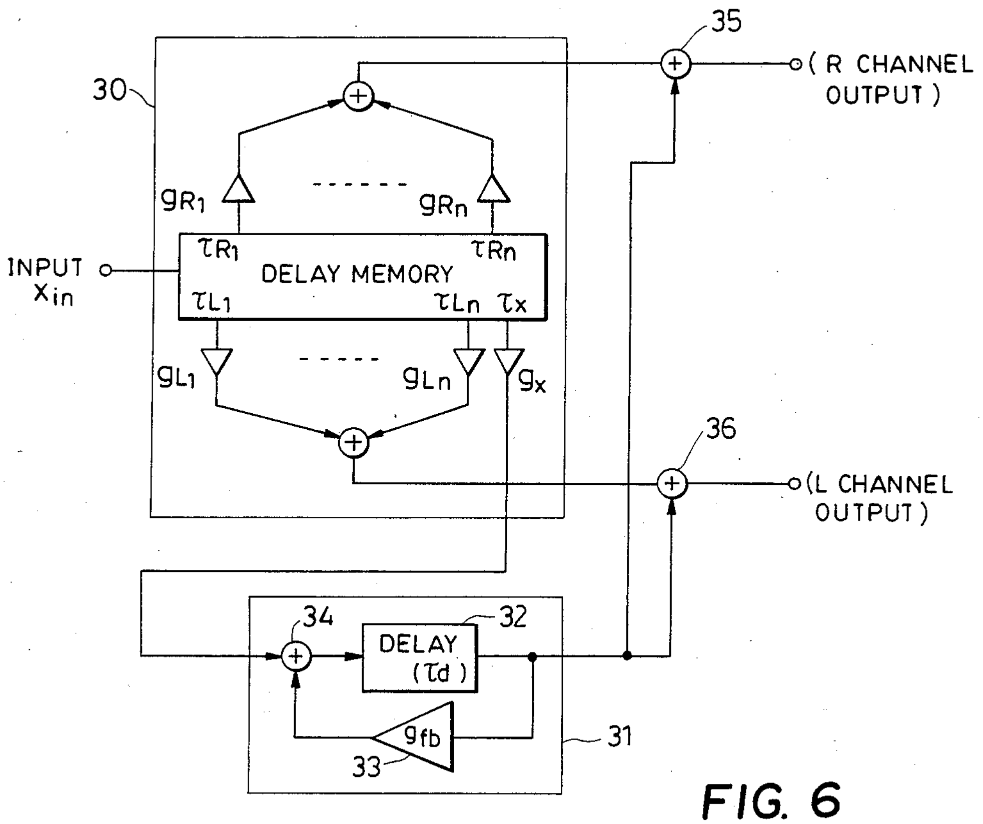
FIG. 6 is a block diagram showing a reverberation imparting device which is a combination of the reverberation imparting device of the present invention and a feed-back or recursive type reverberation imparting device.
Figure 7:
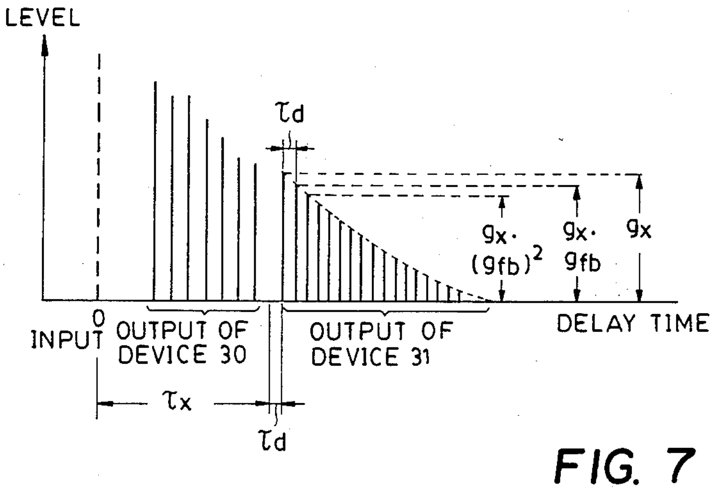
FIG. 7 is a diagram showing an echo time pattern according to the reverberation imparting device of FIG. 6.

The device in the above described embodiment is a feed-forward type reverberation imparting device and its reverberation time is limited by the memory capacity. If a reverberation effect for a longer time is required, the above described embodiment may be combined with a known feed-back or recursive type reverberation imparting device. FIG. 6 shows an example of such combination. A reverberation imparting device 30 is the device according to the present invention shown in FIG. 3. A posterior reverberation imparting device 31 consists of a feed-back type reverberation imparting device in which a reverberation signal of a long time is obtained with a simple construction by feeding back an input signal through a delay circuit 32 (with delay time $\tau d$), an amplitude adjuster 33 (with gain gfb) and an adder 34. The delay memory constituting the reverberation imparting device 30 has an additional output terminal for an input signal to the posterior reverberation imparting device 31 so that the input signal is provided with necessary delay time and gain. The posterior reverberation imparting device 31 produces a feed-back type reverberation signal on the basis of the input signal provided with the necessary delay time $\tau x$ and gain gx. This reverberation signal is added by adders 35 and 36 to the right and left channel reverberation signals from the reverberation imparting device 30 as a posterior reverberation signal succeeding the initial reverberation signal from the reverberation imparting device 30. FIG. 7 shows an echo time pattern thus obtained. It will be noted from this pattern that the reverberation imparting device 30 according to the invention works in the former half of the delay time axis and the posterior reverberation imparting device 31 works in the latter half thereby producing a reverberation effect lasting for a long time.

Since the initial reverberation signal predominantly affects the reverberation characteristics, a sufficiently practicable device can be obtained by employing the above described signals as the posterior reverberation signal.

As described above, by performing superposition (convolution operation) of delay signals for a plurality of sets on the basis of input signal data successively written into a delay memory, plural kinds of reverberation signals can be simultaneously produced. The construction of the reverberation imparting device can therefore be simplified and manufacturing cost of the same can be reduced.

Another embodiment of the invention will now be described. In this embodiment, a plurality of delay signals are divided into several groups and setting and changing of the coefficients are made on the group basis so that setting and changing of the reverberation characteristics can be facilitated.

Figure 8:
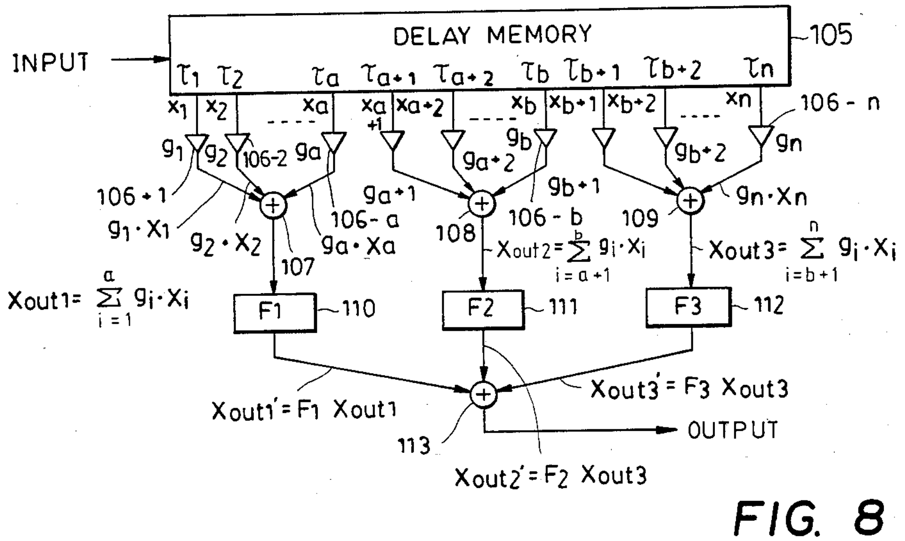
FIG. 8 is block diagram showing another embodiment of the invention.

Referring to FIG. 8, a delay memory 105 has n output taps for delay times $\tau_1$ to $\tau_n$. Delay signals $X_1$ to $X_n$ derived from respective output taps are provided with coefficients by amplitude adjusters (first coefficient operation section) 106-1 through 106-n with gains $g_1$ through $g_n$.

Delay signals $g_1 \bullet X_1$ through $g_n \bullet X_n$ provided by the amplitude adjusters 106-1 through 106-n are divided into three groups ($g_1 \bullet X_1$ through $g_a \bullet X_a$, $g_{a+1} \bullet X_{a+1}$ through $g_b \bullet X_b$ and $g_{b+1} \bullet X_{b+1}$ through $g_n \bullet X_n$) and the delay signals of the respective groups are added together (convolution operation) by adders 107 through 109 and the following signals $Xout_1$ through $Xout_3$ are delivered out by the adders 107 through 109:

$$Xout_1 = \sum_{i=1}^{a} g_i \cdot X_i \quad (1)$$

$$Xout_2 = \sum_{i=a+1}^{b} g_i \cdot X_i \quad (2)$$

$$Xout_3 = \sum_{i=b+1}^{n} g_i \cdot X_i \quad (3)$$

The output signals $X_{out1}$ to $Xout_3$ are provided with coefficients $F_1$ to $F_3$ by second coefficient operation sections 110 to 112. Thus, the following signals $Xout_{1'}$ to $Xout_{3'}$ are provided by the second coefficient operation sections 110 to 112:

$$Xout_{1'} = F_1 \cdot \sum_{i=1}^{a} g_i \cdot X_i \quad (1')$$

$$Xout_{2'} = F_2 \cdot \sum_{i=a+1}^{b} g_i \cdot X_i \quad (2')$$

$$Xout_{3'} = F_3 \cdot \sum_{i=b+1}^{n} g_i \cdot X_i \quad (3')$$

These signals $Xout_{1'}$ to $Xout_{3'}$ are added together by an adder 113 and delivered therefrom as a reverberation signal.

According to the above construction, basic coefficients are set in such a manner that they become gradually small by means of the gains $g_1$ to $g_n$ of the amplitude adjusters 106-1 through 106-n in accordance with the delay characteristics of the reverberation characteristics (such that $g_1$ is the largest gain and decreases in the order of $g_2$, $g_3$, . . . ) so that setting and changing of the parameters can be made only by the coefficients $F_1$ to $F_3$ of the coefficient operation sections 110 through 112. In the case of n=40, for example, setting and changing of the parameters can be made only by the three coefficients $F_1$ to $F_3$. Setting and changing of the parameters can therefore be greatly facilitated.

The second coefficient operation sections 110 through 112 may be constructed as devices which simply perform multiplication (i.e., as normal amplitude adjusters). If they are constructed by filters, provision of coefficients will be performed more effectively. In this case, since a natural reverberation sound has larger attenuation in the frequency range, a low-pass filter in general is suited. The low-pass filter may be of the first order or second or more order. The low-pass filter of the first order will be sufficiently effective for the purpose of the present invention.

Figure 9:
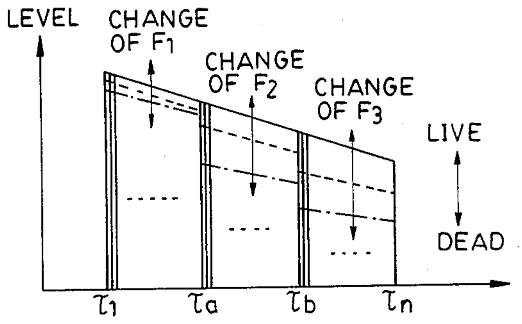
FIG. 9 is a diagram showing a state of control of an echo time pattern according to the reverberation imparting device of FIG. 8.

An echo pattern obtained by the reverberation imparting device of FIG. 8 is shown in FIG. 9. In the case of a signal in which the longer the delay, the larger the delay, i.e., having a small coefficient of reflection (an echo pattern indicated by a chain-and-dot line), the audience have a so-called "dead" impression (i.e., a state in which the reverberation time is short) whereas in the case of a signal in which the longer the delay, the smaller the delay, i.e., having a large coefficient or reflection (an echo pattern indicated by a full line), the audience will have a so-called "live" impression (i.e., a state in which the reverberation time is long). Thus, the device is advantageous in that the liveness control can be made by minimum setting of parameters and, as a result, handling of the device is so easy that an unskilled person can readily operate the device.

Figure 10:
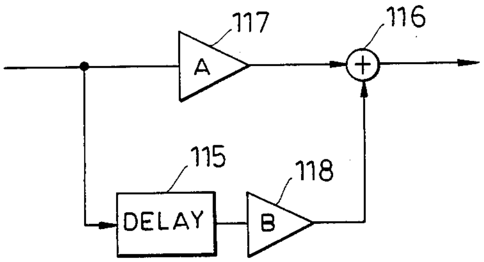
FIG. 10 is a circuit diagram showing a specific example of the second coefficient operation sections 110 through 112 of FIG. 8 constructed of filters.
Figure 11:
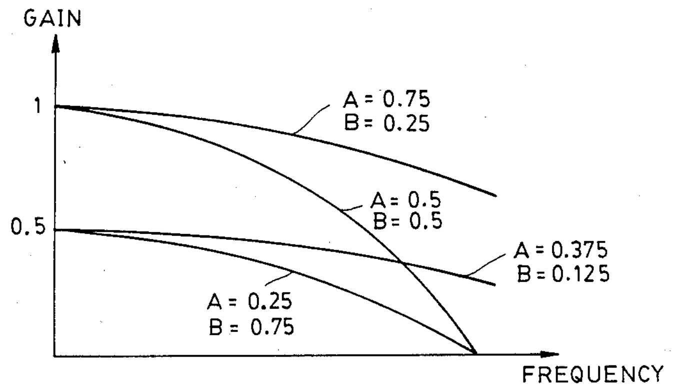
FIG. 11 is a diagram showing a state in which the characteristics of the filter of FIG. 10 are controlled corresponding to combination of gains A and B of amplitude adjusters 117 and 118.

In the case where the second coefficient operation sections 110 through 112 are composed of filters, digital filters as shown in FIG. 10 may advantageously be employed. This filter is of a construction in which a signal derived by passing an input signal through an amplitude adjuster 117 and a signal derived by passing an input signal through a delay circuit 115 delaying an input signal by one sampling period and an amplitude adjuster 118 are added together in an adder 116. According to this construction, various filter characteristics as shown in FIG. 11 can be obtained by selecting combination of gains A and B of the amplitude adjusters 117 and 118. If, accordingly, such filter is employed for the second coefficient operation sections 110 through 112 to set the coefficients $F_1$ to $F_3$ independently from each other, setting of six parameters $A_1$ to $A_3$ and $B_1$ to $B_3$ as shown in FIG. 12 will be sufficient for the operation of the device.

A specific example of the reverberation imparting device of FIG. 8 will now be described. In this example, the second coefficient operation sections 110 through 112 are composed of the digital filters as shown in FIG. 12.

Figure 12:
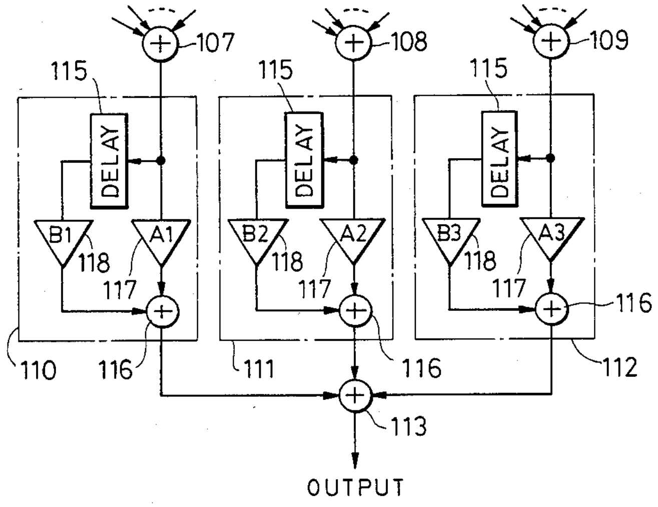
FIG. 12 is a circuit diagram showing an example in which the second coefficient operation sections 110 through 112 of FIg. 8 are constructed of the filters of FIG. 10.
Figure 13:
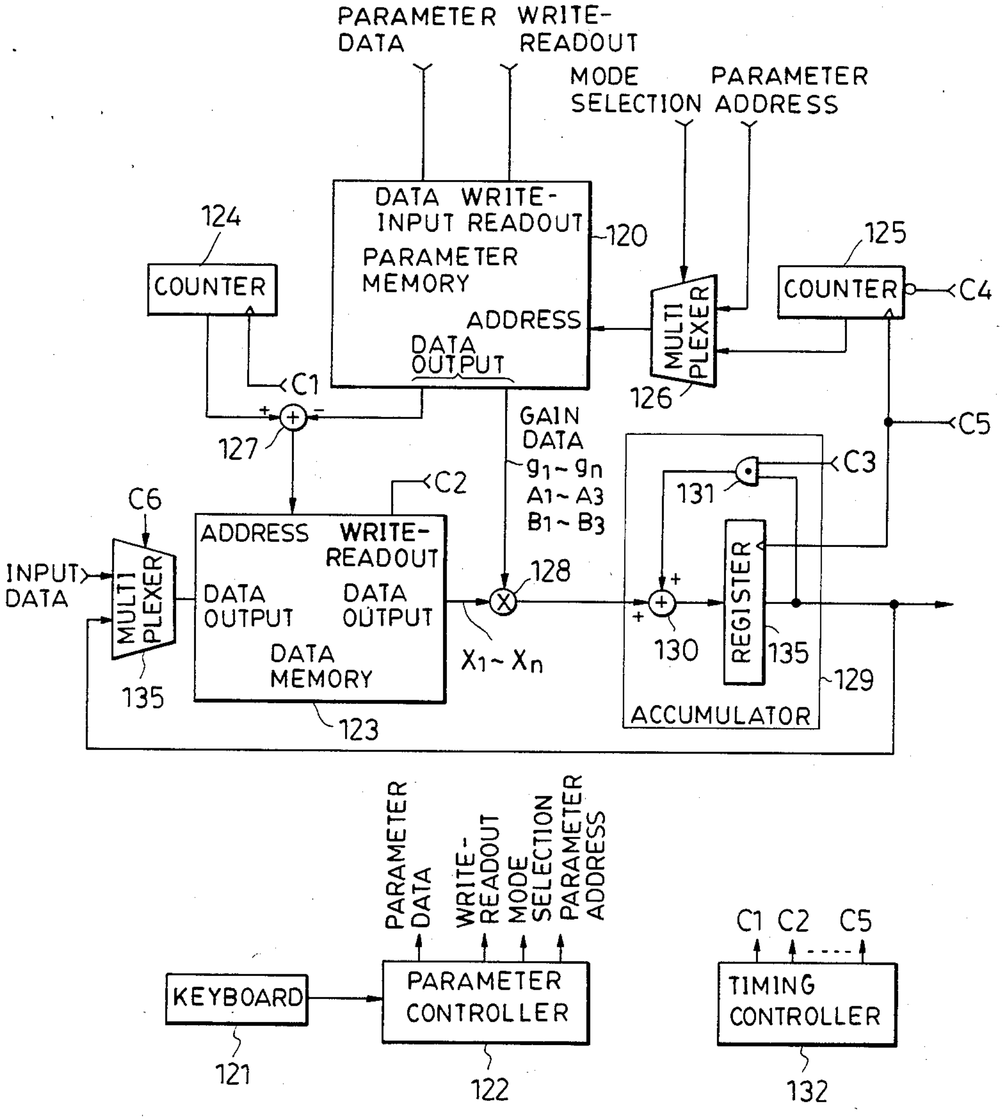
FIG. 13 is a block diagram showing a specific example of the reverberation imparting device of FIG. 8.
Figures 14, 15:
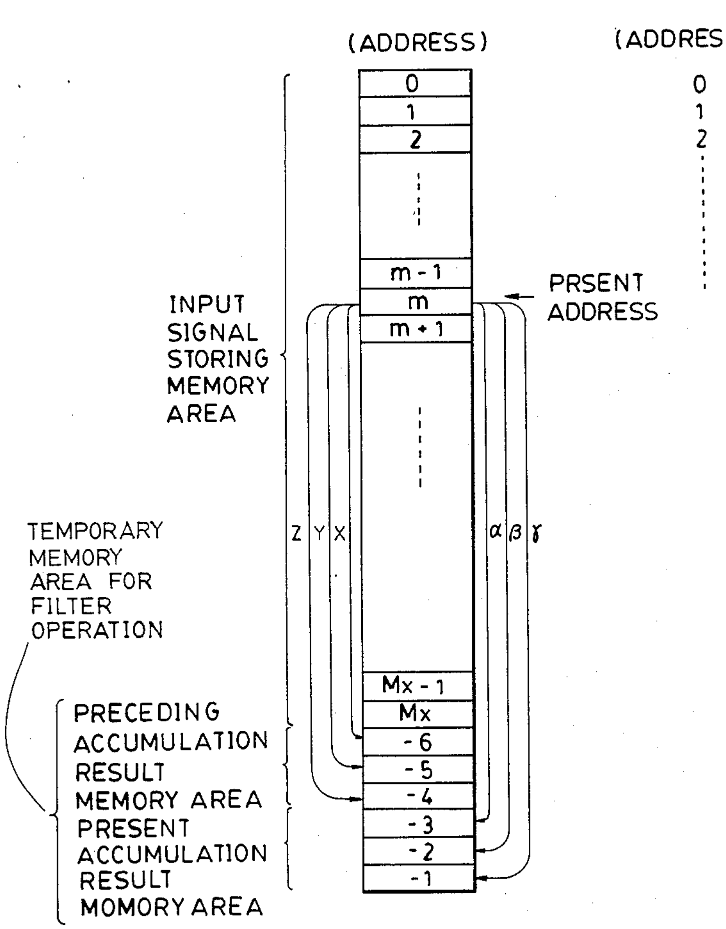
FIG. 14 is a memory map of a data memory 123 shown in FIG. 13.
FIG. 15 is a memory map of a parameter memory 120 shown in FIG. 13.

Referring to FIG. 13, a data memory 123 comprises, as shown in FIG. 14, a memory area successively storing input samples for producing delay signals and a memory area temporarily storing accumulated values of delay signals of respective groups which are accumulated in an accumulator 129 for performing the operation of the digital filters of FIG. 12. The temporary storing memory area for the filter operation has six addresses, i.e., three addresses for storing accumulated values $Xout_1$ to $Xout_3$ of respective groups divided on the basis of an address m for writing the present input sample (hereinafter referred to as the present address) and three addresses for storing accumulated values $[Xout_1]$ to $[Xout_3]$ of respective groups divided on the basis of an address m−1 for writing a preceding input sample. A multiplexer 135 switches an input signal to the data memory 123 between the input sample and the output data of the accumulator 129.

A parameter memory 120 stores, as shown in FIG. 15, pairs of data $\tau_1/\tau_0$ to $\tau_n/\tau_0$ (integer), $\alpha$, $\beta$, $\gamma$, X, Y and Z concerning the addresses of the data memory 123 and gain data $g_1$ to $g_n$, $A_1$ to $A_3$ and $B_1$ to $B_3$. $\tau_0$ represents one sampling period of the input signal. The data $\tau_1/\tau_0$ to $\tau_n/\tau_0$ which represents delay time indicating how many preceding samples is subtracted in a subtractor 127 from the present address m which is counted by a counter 124. The result of subtraction is applied to the data memory 123 as data indicating a readout address for the input sample stored in the data memory 123. $\alpha$,$\beta$ and $\gamma$ are position computing data for obtaining addresses where the accumulated values $Xout_1$ to $Xout_3$ of the respective groups based on the present address m are temporarily stored. X, Y and Z are addresses for temporarily storing the accumulated values $[Xout_1]$ to $[Xout_3]$ of the respective groups based on the address m−1 at which a preceding sample was written (See FIG. 14). These addresses $\alpha$, $\beta$, $\gamma$, X, Y and Z are relative addresses based on the present address m and are subtracted in the subtractor 127 from the present address m which is counted by the counter 124. The result of the subtraction is applied to the data memory 123 as address data representing addresses for storing the accumulated values $Xout_1$ to $Xout_3$ and $[Xout_1]$ to $[Xout_3]$ of the respective groups. Accordingly, values of $\alpha$, $\beta$, $\gamma$, X, Y and Z differ depending upon the position of the present address m. If, for example, write addresses for the accumulated values (absolute addresses) are −6, −5, . . . , −1 as shown in FIG. 14, since $$m-X=-6$$

$$m-Y=-5$$

$$m-Z=-4$$

$$m-\alpha=-3$$

$$m-\beta=-2$$

$$m-\gamma=-1,$$

X, Y, Z, $\alpha$, $\beta$ and $\gamma$ are set as follows:

$$X=m+6$$

$$Y=m+5$$

$$Z=m+4$$

$$\alpha=m+3$$

$$\beta=m+2$$

$$\gamma=m+1$$

Writing of the respective parameters into the parameter memory 120 is performed by a parameter controller 122 in response to the operation of a keyboard 121.

A counter 124 designates, as described above, the present address m for writing data into the data memory 123 and is counted up each one sampling period of the input signal.

A counter 125 designates readout address of the parameter memory 120 and designates all addresses of the parameter 120 in one sampling period thereby causing the parameters shown in FIG. 15 to be read out successively.

A multiplexer 126 switches the address data to be supplied to the parameter memory 120 between write address from the parameter controller 122 and readout address from the counter 125.

The subtractor 127 converts, as described above, the address data read out from the parameter memory 120 (relative address) to absolute address based on the present address m of the counter 124 and supplies this data to the data memory 123 as the address data.

A multiplier 128 provides the delay signals $X_1$ to $X_n$ read out from the data memory 123 with the gain data $g_1$ to $g_n$ read out from the parameter memory 120 and also provides the accumulated values of the $Xout_1$ to $Xout_3$ and $[Xout_1]$ to $[Xout_3]$ of the respective groups read out from the data memory 123 with the gain data $A_1$ to $A_3$ and $B_1$ to $B_3$ to obtain $Xout_{1'}$ to $Xout_{3'}$ of the equations (1') to (3').

An accumulator 129 cumulatively adds (i.e., convolution operation) the delay signals produced by the multiplier 128 by groups in a register 135 and an adder 130 to produce the accumulated data $Xout_1$ to $Xout_3$ of the equations (1) to (3) and also cumulatively adds the accumulated data $Xout_{1'}$ to $Xout_{3'}$ of the respective groups produced by the multiplier 128 to finally produce a reverberation signal. An AND gate 131 is turned off by a signal C3 each time the accumulated data of the respective groups and the final reverberation data are produced thereby resetting the accumulated value to 0.

A timing controller 132 is provided to produce timing signals C1 to C6 for operating the above described circuits.

The operation of the device shown in FIG. 13 will now be described.

(1) Setting of parameters

In using the reverberation imparting device shown in FIG. 13, the delay time data $\tau_1$ to $\tau_n$ and the gain data $g_1$ to $g_n$, $A_1$ to $A_3$ and $B_1$ to $B_3$ are respectively set. The setting of these parameters is controlled by the parameter controller 122. That is, the parameter memory 120 is switched to the writing mode and the multiplexer 126 to the setting mode by operation of the keyboard 121 to set these parameters.

(2) Production of reverberation signals

Upon setting of the parameters, the parameter memory 120 is switched to the readout mode and the multiplexer 126 is switched to the side of the counter 125 to supply an input signal to the data memory 123 and produce reverberation signals.

The reverberation signal is produced by performing the following processings within one sampling period of an input signal Xin: 1 writing of an input signal Xin into the data memory 123, 2 reading of delay signals $X_1$ to $X_n$ corresponding to the respective delay time $\tau_1$ to $\tau_n$ from the data memory 123, 3 imparting of the coefficients $g_1$ to $g_n$ to the read-out delay signals $X_1$ to $X_n$, 4 accumulation by groups of the delay signals imparted with the coefficients, 5 writing of the accumulated data $Xout_1$ to $Xout_3$ of the respective groups into the data memory 123, 6 reading out the accumulated data $Xout_1$ to $Xout_3$ of the respective groups and preceding accumulated data $[Xout_1]$ to $[Xout_3]$ from the data memory 123, 7 imparting of the coefficients $A_1$ to $A_3$ and $B_1$ to $B_3$ to the read-out accumulated data $Xout_1$ to $Xout_3$ and $[Xout_1]$ to $[Xout_3]$ and 8 accumulation of the accumulated data imparted with the coefficients.

Figure 16:
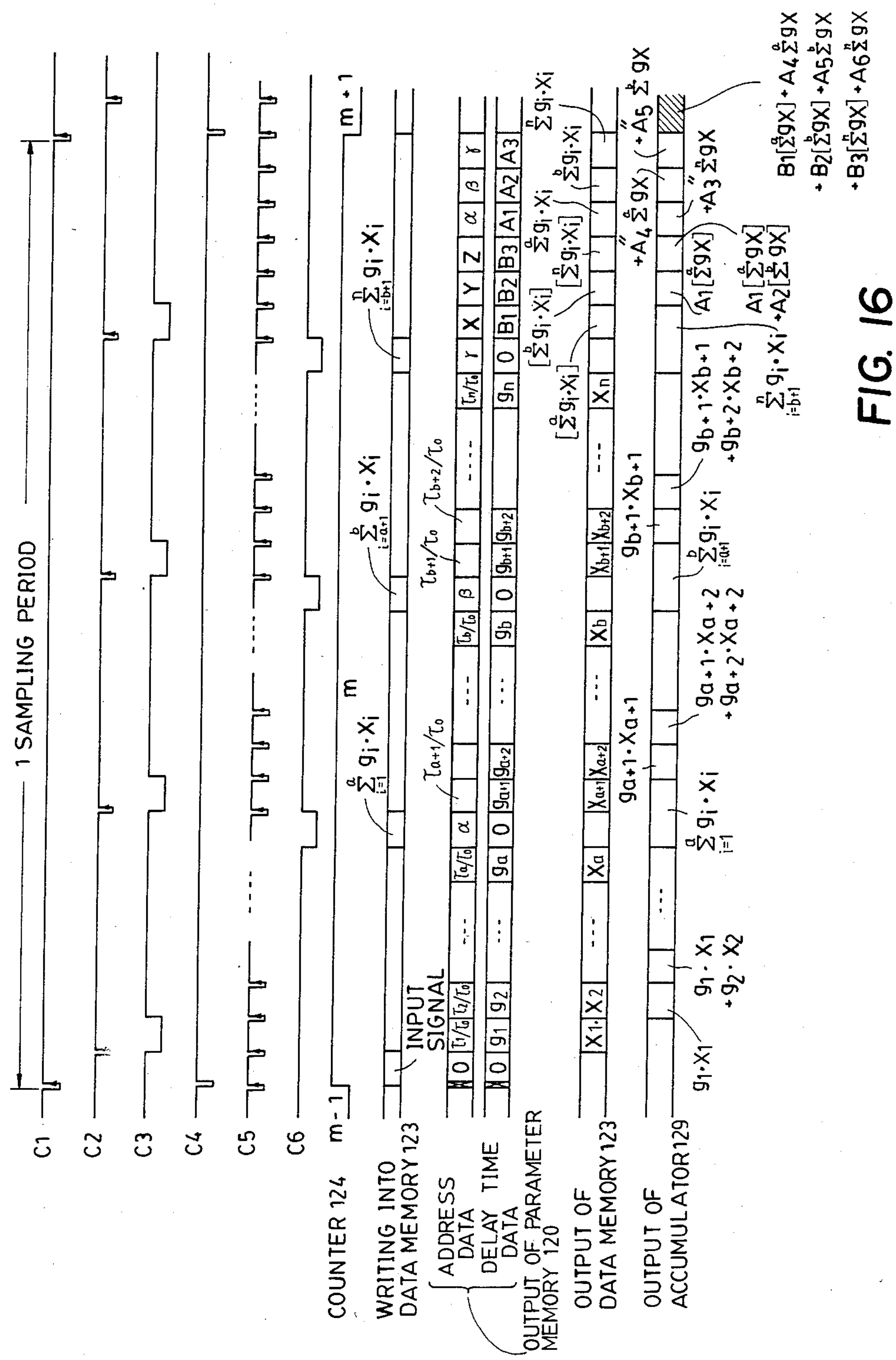
FIG. 16 is a time chart showing the operation of the reverberation imparting device of FIG. 13.

The respective processings will be described with reference to the time chart of FIG. 16.

1 Writing of an input signal into the data memory 123

A clock C4 falls at the rise of a clock C1 thereby clearing the counter 125. Accordingly, the address 0 is designated in the parameter memory 120 so that the read-out delay time data $\tau_i/\tau_0$ and gain data $g_i$ are both 0 (See FIG. 15).

At the rise of a next clock C5, the clock C2 also rises bringing the data memory 123 into the write mode. Since the delay time date $\tau_i/\tau_0$ from the parameter memory 120 at this time is "0" as described above, the output of the subtractor 127 is the output of the counter 124, i.e., the present address itself so that an input signal is written at the present address m of the data memory 123 indicated by the counter 124.

2 Reading of the delay signal from the data memory 123

Upon completion of the writing into the data memory 123, the data memory 123 is switched to the read out mode. The counter 125 counts clock C5 and supplies this count to the parameter memory 120 to read out the delay time data $\tau_i/\tau$HD 0 and the gain data $g_i$. When, for example, the count of the counter 125 is "1", the delay time data $\tau_1/\tau_0$ and the gain data $g_1$ are read out from the address 1 of the parameter memory 120. Subsequently, the data $\tau_2/\tau_0$ and $g_2$ are read out from the address 2, . . . , $\tau_n/\tau_0$ and $g_n$ from the address n sucessively.

The delay time data $\tau_i/\tau_0$ read out from the parameter memory 120 is subtracted from the count of the counter 124 in the subtractor 127 and an address before the present address m, i.e., the present count of the counter 124, by distance represented by the delay time data $\tau_i/\tau_0$ is provided by the subtractor 127, whereby the delay signals $X_i$ stored at the corresponding addresses in the data memory 123 are read out.

3 Imparting of first coefficients

The delay signals $X_i$ read out from the data memory 123 are provided with the corresponding gain data $g_i$ read out from the parameter memory 120 by the multiplier 128.

4 Accumulation

The delay signals $g_i \bullet X_i$ provided by the multiplier 128 are cumulatively added in the accumulator 129. Each time the result of accumulation for each group is provided, the accumulator 129 is reset by clock C3 and accumulation of a next group is successively performed.

5 Writing of the result of accumulation into the data memory 123

Before the accumulated values $Xout_1$ to $Xout_3$ of the respective groups are reset, the multiplexer 135 is switched by clock C6 to the side of the accumulator 129, the data memory 123 is switched by clock C2 to the write mode and the data $\alpha$, 62 and $\gamma$ are produced by the parameter memory 120 and the accumulated values $Xout_1$ to $Xout_3$ are written at predetermined address (see FIG. 14) of the data memory 123. Since preceding accumulated values [$Xout_1$] to [$Xout_3$] are required in the operation of the filter shown in FIG. 12, these accumulated values $Xout_1$ to $Xout_3$ are held until a next sampling period ends.

6 Reading out of the present and preceding accumulated values from the data memory 123

Upon storing of the accumulated values $Xout_1$ to $Xout_3$ of the respective groups in the data memory 123, the data X, Y, Z, $\alpha$, $\beta$ and $\gamma$ are successively read out from the parameter memory 120 in response to clock C5, and the preceding accumulated values [$Xout_1$] to [$Xout_3$] of the respective groups and the present accumulated values $Xout_1$ to $Xout_3$ are successively read out from the data memory 123.

7 Imparting of second coefficients to the respective accumulated values

Upon reading out of the preceding and present accumulated values [$Xout_1$] and [$Xout_3$] and $Xout_1$ to $Xout_3$ from the data memory 123, the coefficients $B_1$, $B_2$, $B_3$, $A_1$, $A_2$ and $A_3$ are successively read out from the parameter memory 120 in synchronization with the reading out of these accumulated values, whereby imparting of the second coefficients is effected in the multiplier 128.

8 Accumulation of the accumulated data imparted with the second coefficients

The data having thus been imparted with the second coefficients and delivered out of the multiplier 128 is cumulatively added in the accumulator 129 to finally produce reverberation signals. These reverberation signals are converted to analog signals and thereafter are delivered out for sounding.

Changing of the reverberation characteristics can be readily made by changing values of the six gain data $A_1$ to $A_3$ and $B_1$ to $B_3$ stored in the parameter memory 120.

Figure 17:
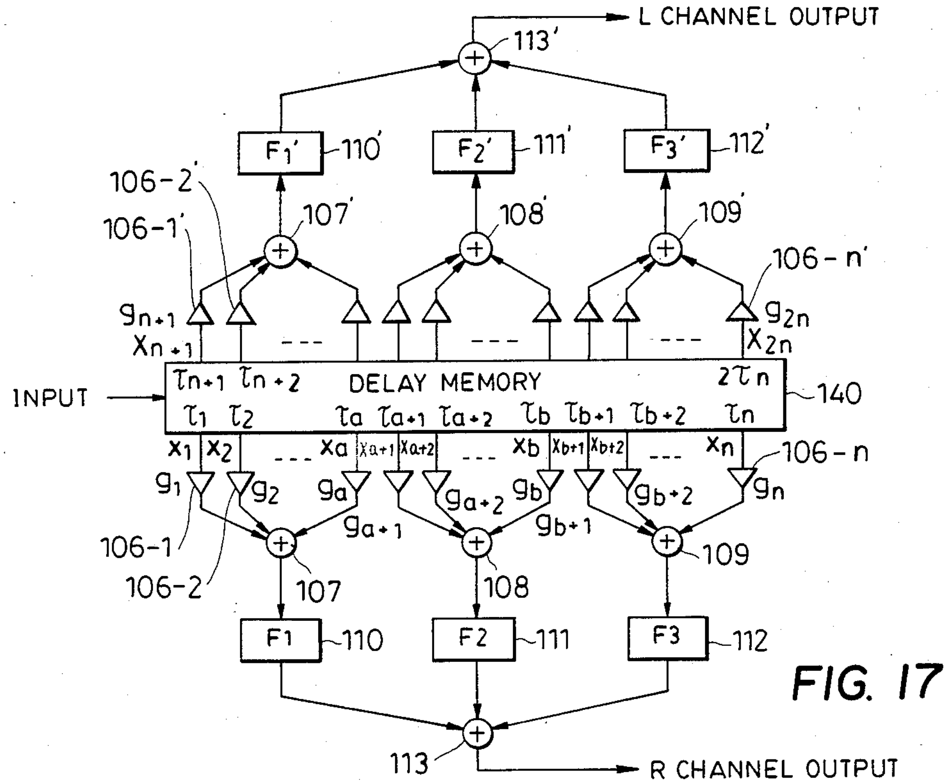
FIG. 17 is a block diagram showing another embodiment of the invention in which reverberation signals are produced in plural channels.

In the present embodiment, the reverberation signal is produced in a single channel. If, however, the memory area of a delay memory (data memory) 140 is divided as shown in FIG. 17 and each memory area is constructed as shown in FIG. 8, reverberation signals can be produced in plural channels by sharing the single delay memory 140.

Figure 18:
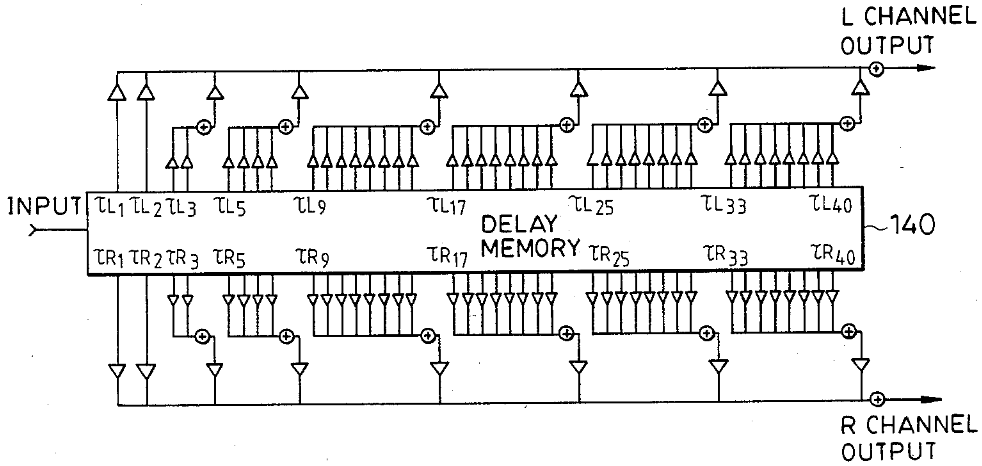
FIG. 18 is a circuit diagram showing an example of grouping of delay signals in this invention in which the numbers of delay signals to be allotted to respective groups are made different according to delay time.

The number of delay signals to be allotted to the respective groups need not necessarily be equal. Considering, for example, that a reflected sound of a short delay time (reflected sound of a low order) generally has a large gain (i.e., occupies a large portion in the reverberation characteristics), it is desirable from the standpoint of improving the operation efficiency without impairing natural reverberation characteristics to control reflected sounds of a short delay time individually and ones of a long delay time collectively in a group. An example of such construction is shown in FIG. 18. In this example, reverberation signals of two channels are produced as in the example of FIG. 17.

As described in the foregoing, a plurality of delay signals for forming a reverberation signal are divided into groups and setting and changing of coefficients are made on the group basis so that setting and changing of the reverberation characteristics is facilitated.

A still another embodiment of the invention capable of facilitating an operation for setting the reverberation characteristics by collectively performing setting and changing of coefficient parameters will be described below.

Figure 1A:
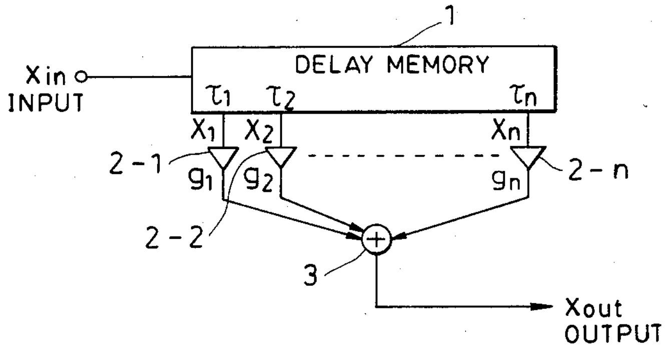
FIG. 1(a) PRIOR ART
FIG. 1(a) is a block diagram showing a prior art reverberation imparting device.
Figure 1B:
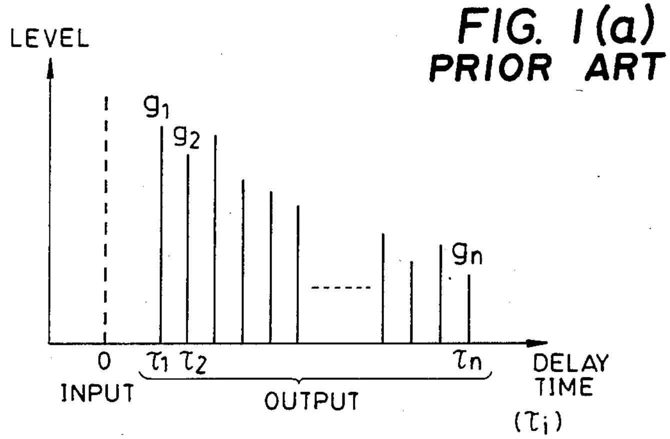
FIG. 1(b) PRIOR ART
FIG. 1(b) is a diagram showing an echo time pattern according to the device shown in FIG. 1(a)
Figure 2:
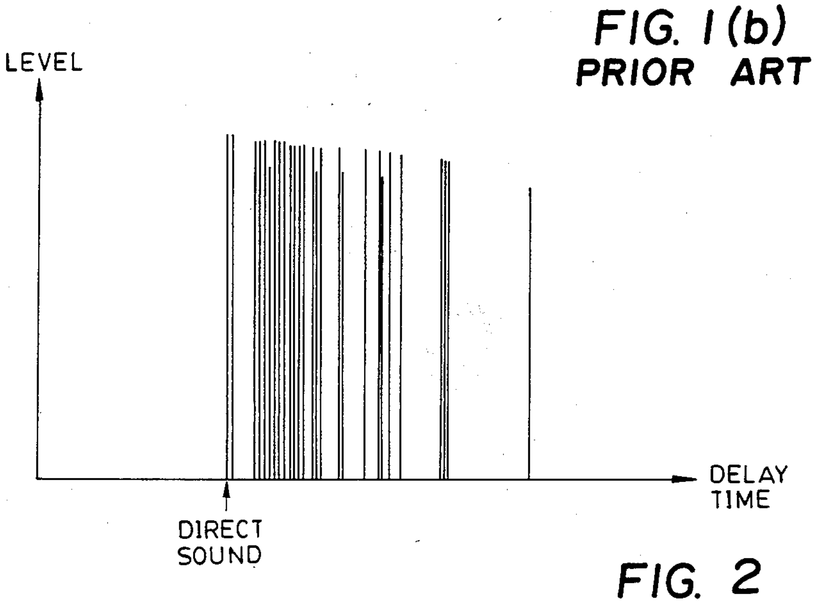
FIG. 2 is a diagram of an echo time pattern showing result of simulation of primary and secondary reflected sounds in a certain actually existing concert hall.
Figure 19:
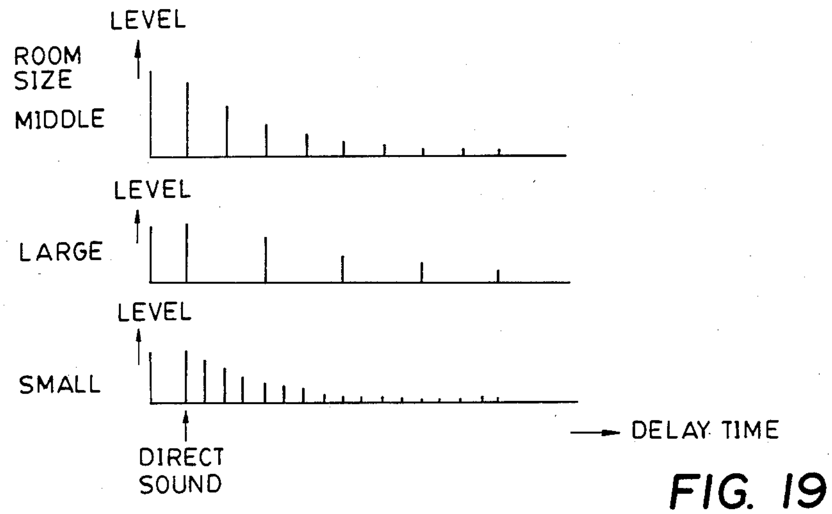
FIG. 19 is a diagram showing a state in which the echo time pattern enlarges or reduces proportionally with the room size.
Figure 20:
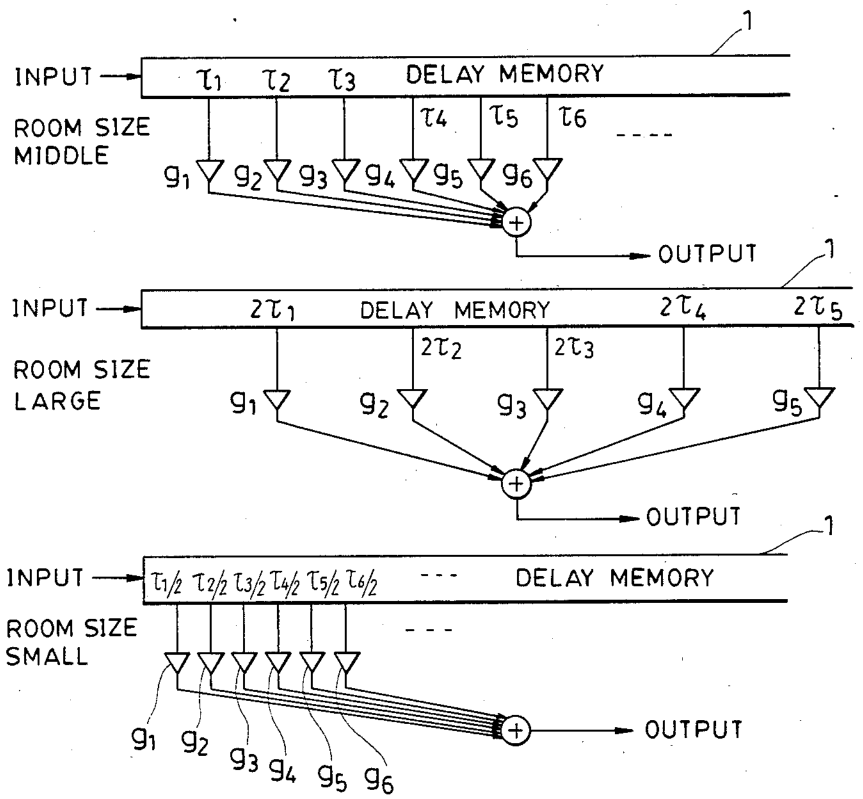
FIG. 20 is a diagram showing a state of setting of delay times for obtaining respective echo patterns of FIG. 19 from the reverberation imparting device of FIG. 1(a)

Since distance of transmission of a sound in a room increases as the room becomes larger, time required for the reverberation sound to return becomes longer in proportion to the size of the room. If, accordingly, there are rooms which are substantially of the same shape but of different size, the echo time patterns assume patterns which, as shown in FIG. 19, are timewise magnified or reduced. In case a reverberation signal is produced by employing a delay memory shown in FIG. 1(*a*), the time interval for reading out respective delay signals may be expanded or diminished as shown in FIG. 20 at a proper ratio in accordance with the size of the room. In such a case, therefore, what has to be done is only determination of correlation between the room size and the readout time interval and setting and changing of the delay times can be made by simply changing the magnitude of coefficient to be imparted to these delay signals in accordance with the room size. Consequently, setting and changing of the delay times can be readily made.

Figure 21:
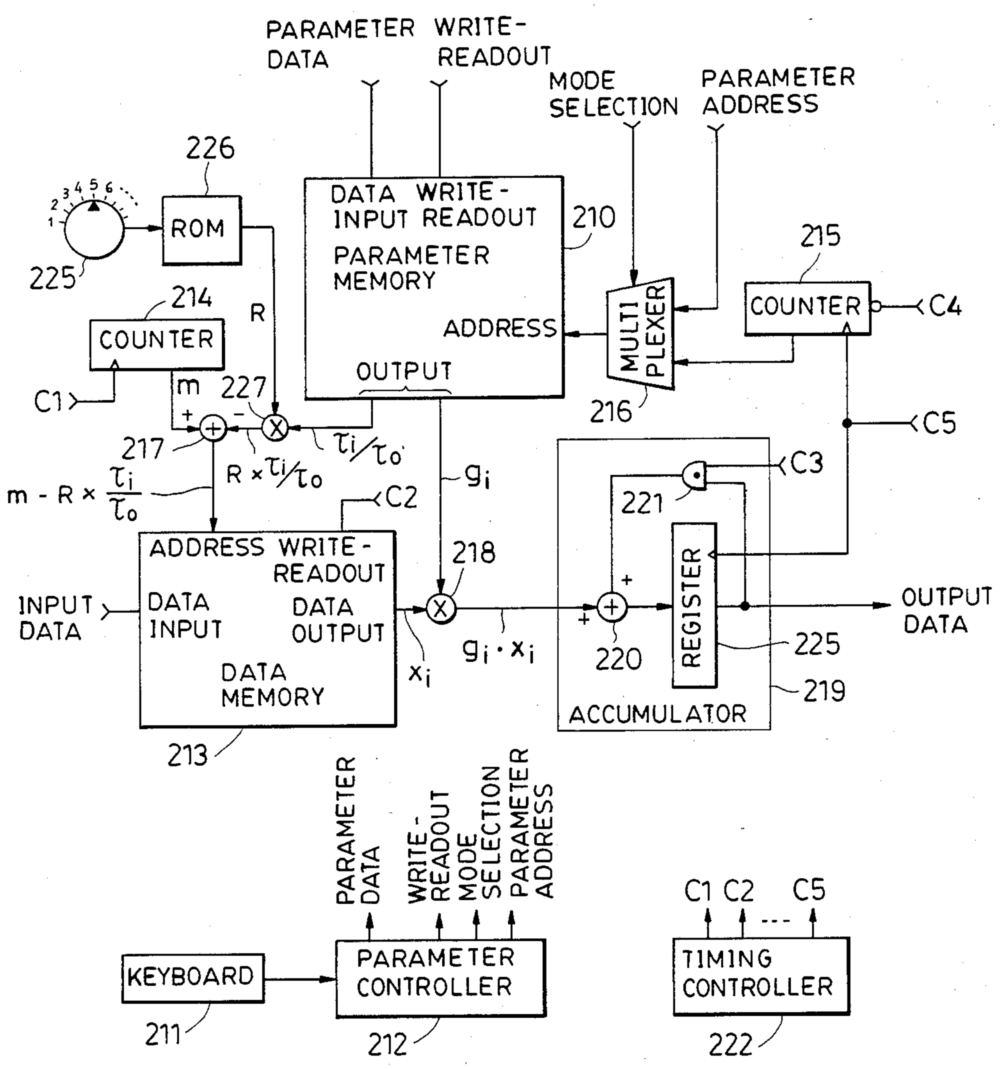
FIg. 21 is a block diagram showing still another embodiment of the invention.

FIG. 21 shows an embodiment of the invention constructed on the above described principle.

In FIG. 21, a parameter memory 210 has n+1 addresses of 0 to n and stores respective parameters, i.e., delay time data $\tau_i/\tau_0$ and gain data $g_i$, at the respective addresses. The parameters stored at the respective addresses are shown in the following Table 2:

TABLE 2

| address | delay time data (integer) | gain data |
|---|---|---|
| 0 | 0 | 0 |
| 1 | $\tau_1/\tau_0$ | $g_1$ |
| 2 | $\tau_2/\tau_0$ | $g_2$ |
| 3 | $\tau_3/\tau_0$ | $g_3$ |
| . | . | . |
| . | . | . |
| . | . | . |
| n | $\tau_n/\tau_0$ | $g_n$ |

In this table, $\tau_0$ indicates one sampling period of an input signal. The delay time data $\tau_1/\tau_0$, $\tau_2/\tau_0$, . . . (value in integers) indicate sample positions corresponding to the delay times $\tau_1$, $\tau_2$, . . . (i.e., how many samples before). At the time, for example, $\tau_0$=20 msec and $\tau_i$=100 msec, $\tau_i/\tau_0$=100/20=5 and, accordingly, the delay time data of "5" indicate the sample position "5"-address before.

Writing of parameters into the parameter memory 210 is performed by a parameter controller 212 in response to the operation of a keyboard 211.

A switch 225 is provided for setting a room size. A ROM 226 stores coefficient R corresponding to the room size and produces, for example, the following values in Table 3 as the coefficient R corresponding to the room size in accordance with the selected position of the switch 225.

TABLE 3

| Selected position of Switch 225 | Coefficient R |
|---|---|
| 1 | 1.25 |
| 2 | 0.5 |
| 3 | 1.0 |
| 4 | 2.0 |
| 5 | 4.0 |
| . | . |
| . | . |

TABLE 3-continued

| Selected position of Switch 225 | Coefficient R |
|---|---|
| . | . |

Figure 22:
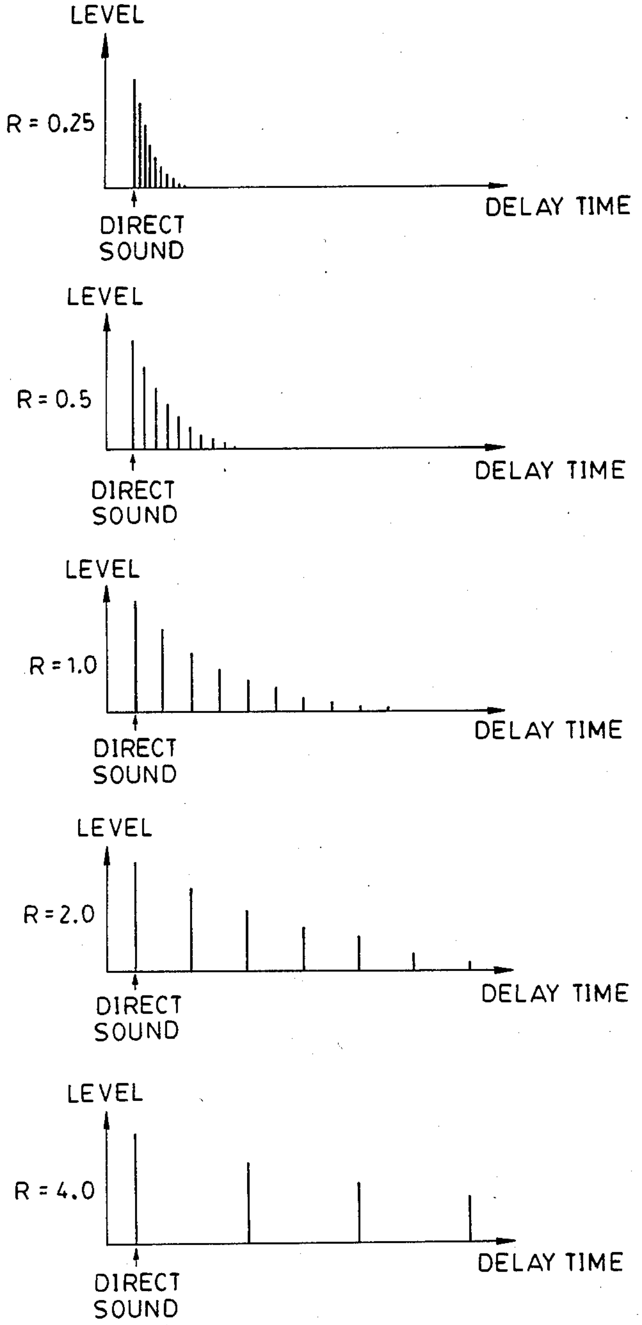
FIG. 22 is a diagram of an echo time pattern showing that time sequence of data produced by a multiplier 227 of FIG. 21 changes in response to room size coefficient R.

The room size coefficient R read out from the ROM 226 is multiplied with the delay time data $\tau_i/\tau_0$ in a multiplier 227 and a delay time data $R\times(\tau_i/\tau_0)$ is produced by the multiplier 227. The time sequence of this delay time data $R\times(\tau_i/\tau_0)$ is magnified or reduced as shown in FIG. 22 in response to the room size coefficient R while the gain data $g_1, g_2, \ldots, g_n$ remains unchanged.

A data memory (delay memory) 213 is constituted of a RAM. A digital input signal obtained by converting an analog input signal is successively written into this data memory 213 and data at an address corresponding to the delay time data $R\times(\tau_i/\tau_0)$ produced by the multiplier 227 is read out from the data memory 213 to constitute delay data.

A counter 214 designates an address m at which writing of the digital signals into the data memory 213 is to be made. The address m is hereinafter referred to as present address. The counter 214 is counted up at each sampling period.

A counter 215 designates a readout address of the parameter memory 210. The counter 215 is counted up from 0 to n during one sampling period of an input signal to provide the delay time data $\tau_i/\tau_0$ and the gain data $g_i$.

A multiplexer 216 switches an address order to be applied to the parameter memory 210 between a write address from the parameter controller 212 and a readout address from the counter 215.

A subtractor 217 provides difference between the present address from the counter 214 and the delay time data $R\times(\tau_i/\tau_0)$ from the multiplier 227 as an address order for the data memory 213. The data memory 213 is changed into the write mode when the readout address of the parameter memory 210 is 0 (i.e., the read out delay time data and gain data are both 0 as shown in Table 2), and the output of the subtractor 217 (i.e., the present address m from the counter 214 itself) at this time is applied as the write address to the data memory 213. On the other hand, the data memory 213 is changed into the readout mode during time when the readout address of the parameter memory 210 is not 0, and the output of the subtractor 217 (i.e., an address which is before the present address m by a distance corresponding to the delay time data $R\times(\tau_i/\tau_0)$) is applied as the readout address order to the data memory 213.

A multiplier 218 provides a delay signal $X_i$ read out from the data memory 213 with gain data $g_i$ read out from the parameter memory 210.

An accumulator 219 cumulatively adds (performing convolution operation) delay signals $g_i \bullet X_i$ provided by the multiplier 218 by a register 225 and an adder 20 to produce reverberation signals shown in the above equation (1) or (2). The reverberation signals thus produced by the accumulator 219 are converted to analog signals and thereafter are delivered out for sounding. An AND gate 221 is provided to interrupt accumulated data by application of a signal C3 each time a reverberation signal has been produced, thereby resetting the accumulated value to 0.

A timing controller 222 is provided for producing timing signals C1 to C5 which are used for operating the above described circuits.

(1) Setting of parameters and the room size

In using this device, the respective parameters, i.e., the delay time data $\tau_i$ and the gain data $g_i$ are first set. The setting of the parameters is controlled by the parameter controller 212. That is, the parameter memory 210 is switched to the write mode by the operation of the keyboard 211 and the multiplexer 216 is switched to a setting mode to set these parameters. The room size is set by the switch 225.

(2) Production of reverberation signals

Upon setting of the parameters, the parameter memory 210 is switched to the readout mode and the multiplexer 216 is switched to the side of the counter 215 to supply an input signal to the data memory 213 and prepare reverberation signals.

Figure 23:
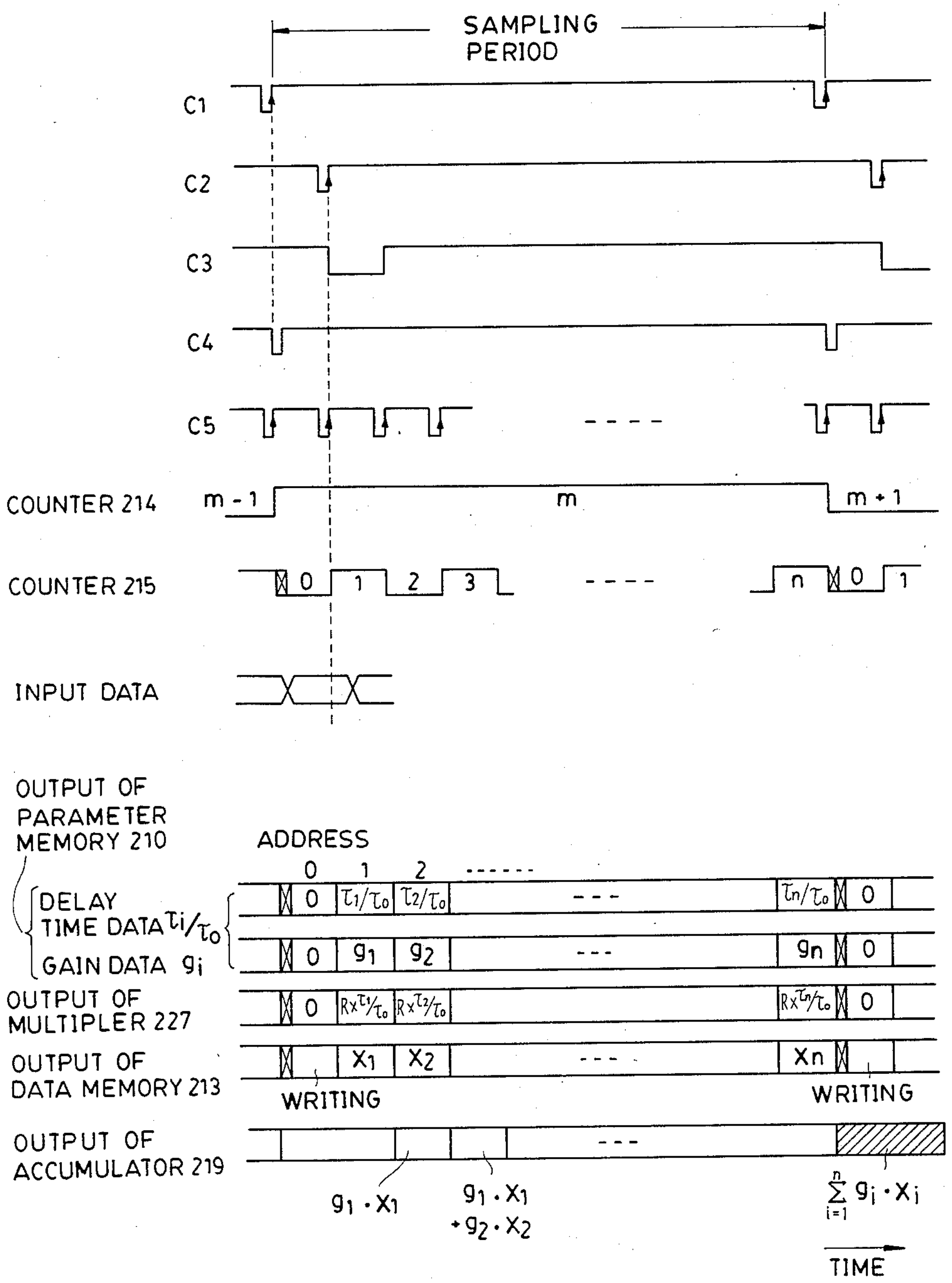
FIG. 23 is a time chart showing the operation of the device of FIG. 21.

The reverberation signal is produced within one sampling period of an input signal. In one sampling period, processings of 1 writing of an input signal into the data memory 213, 2 reading of delay signals $X_i$ corresponding to the respective delay times $R\times(\tau_i/\tau_0$ from the data memory 213, 3 imparting of gain $g_i$ to the read-out delay signals $X_i$ and 4 respective processings of accumulation (convolution operation) of the delay signals $X_i$ are sequentially performed to produce a reverberation signal. The respective processings will be described with reference to a time chart of FIG. 23.

1 Writing of an input signal into the data memory 213

A clock C4 falls at the rise of a clock C1 thereby clearing the counter 215. Accordingly, the address 0 is designated in the parameter memory 210 so that the read-out delay time data and gain data are both 0. At the rise of a next clock C5, the clock C2 also rises bringing the data memory 213 into the write mode. Since the delay time data from the parameter memory 210 at this time is 0 as described above, the output of the multiplier 227 is also 0 and the output of the subtractor 217 is the output of the counter 214 itself, i.e., the present address m so that an input signal is written at the address m of the data memory 213.

2 Reading of the delay signal from the data memory 213

Upon completion of the writing into the data memory 213, the data memory 213 is switched to the readout mode. Within one sampling period, clock C5 rises once for the above described writing and n times for reading, totalling n+1 times. The counter 15 counts this clock C5 and supplies this count to the parameter memory 210 to read out the delay time data $\tau_i/\tau_0$ and the gain data $g_i$. When, for example, the count of the counter 214 is 1, the delay time data $\tau_i/\tau_0$ and the gain data $g_1$ are read out from the address 1 of the parameter memory 210. Subsequently, the data $\tau_2/\tau_0$ and $g_2$ are read out from the address 2, the data $\tau_3/\tau_0$ and $g_3$ from the address 3, $\ldots$, $\tau_n/\tau_0$ and $g_n$ from the address n successively.

The delay time data $\tau_i/\tau_0$ read out from the parameter memory 210 is imparted in the multiplier 227 with the room size coefficient R to become $R\times(\tau_i/\tau_0)$ and further is subtracted from the count of the counter 214 in the subtractor 217 whereby count of the counter 214, i.e., address data before the present address m by distance represented by the delay time data $R\times(\tau_i/\tau_0)$ is provided by the subtractor 217, so that the delay signals $X_i$ stored at the corresponding address in the data memory 213 is read out.

3 Imparting of gain data $g_i$

The delay signal $X_i$ read out from the data memory 213 is provided in the multiplier 218 with corresponding gain data $g_i$ read out from the parameter memory 210.

4 Accumulation

In an accumulator 219, when the count of a counter 215 is 1, an accumulated value in the preceding sampling period (m−1) is reset by clock C3 and delay data $g_1 \bullet X_1, g_2 \bullet X_2, \ldots, g_n \bullet X_n$ in the present sampling period (m) are accumulated to produce $$\sum_{i=1}^{n} g_i \cdot X_i$$

in response to the clocks C5. This accumulated data is converted to analog data and is delivered out as the reverberation signal.

Instead of effecting the imparting of the room size coefficient R in the multiplier 227 as in the above described embodiment, the same result may be obtained by shifting the bit of the delay time data $\tau_i/\tau_0$ by means of a shifter. Relationship between the room size coefficient R and the shift amount of corresponding delay time data $\tau_i/\tau_0$ is shown in Table 4.

TABLE 4

| Room size coefficient R | Shift amount |
|---|---|
| 0.25 $\left(= \frac{1}{2^2}\right)$ | 2 bit shift-down |
| 0.5 $\left(= \frac{1}{2^1}\right)$ | 1 bit shift-down |
| 1 $(= 2^0)$ | No shifting |
| 2 $(= 2^1)$ | 1 bit shift-up |
| 4 $(= 2^2)$ | 2 bit shift-up |

The relatively expensive multiplier 227 can be obviated by employing the shifter whereby the device can be constructed at a reduced cost.

In the above described embodiment, description has been made with respect to a case wherein the delay time data sequence is set and changed in accordance with the room size. This invention is however applicable to cases where the delay time data sequence is set and changed in accordance with factors determining the reverberation characteristics other than the room size. The invention is applicable also to setting and changing of parameters of data sequence concerning the delay data such as gain data $g_i$.

As described above, according to this embodiment, data sequence of the delay data as a whole is set and changed in a proportionally magnified or reduced form. It is therefore not necessary to set and change the delay data individually and, accordingly, setting and changing operation can be facilitated.

What is claimed is:

1. A reverberation imparting device comprising:

a single delay memory receiving and storing samples of input signal data in different memory locations;

addressing means for causing the delay memory to be addressed to read out a plurality of delay signals corresponding to predetermined delay times;

adjusting means for controlling the operation of the addressing means to cause different memory locations to be addressed to collectively alter said predetermined delay times by a common factor;

addition means for adding a first group of said delay signals to produce a first added signal and adding a second group of said delay signals to produce a second added signal; and output means for receiving and electrically adding the added signals and outputting a single reverberation signal.

2. A reverberation imparting device comprising:

a delay memory receiving and storing samples of input signal data in different memory locations;

a parameter memory for storing parameter data corresponding to delay signals which are to be formed, said parameter data including, for each delay signal to be formed, at least (a) delay time data representative of the amount of delay of the delay signal with respect to the input signal and (b) gain data representative of a gain coefficient of the delay sigal;

control means for (a) addressing the delay memory to read out a plurality of delayed signals therefrom in accordance with the delay time data and (b) impart each read-out delayed signal with a gain in accordance with the gain data so as to form said delay signals, wherein the control means includes means for reading the parameter data from the parameter memory corresponding to a plurality of said delay signals; and modifying each item of read-out data by a common factor; and addition means for electrically adding the delay signals to produce a single reverberation signal.

3. A reverberation imparting device comprising:

a single delay memory storing input signal data at a predetermined sampling period and producing a plurality of delay signals corresponding to time intervals between the writing of said input signal data and the reading thereof;

coefficient operation means for imparting coefficients to said plurality of delay signals read out from said delay memory;

first addition means for adding distinct groups of said coefficient-imparted plural delay signals read out from said delay memory and producing a plurality of added signals; and second addition means for further electrically adding said added signals from said first addition means to provide a single reverberation signal as a reverberation output.

4. A reverberation imparting device as defined in claim 3 further comprising group coefficient operation means for imparting coefficients to said plurality of added signals from said first addition means.

5. A reverberation imparting device as defined in claim 3 wherein said delay memory comprises a random-access memory.

6. A reverberation imparting device as defined in claim 3 further comprising adjusting means for collectively adjusting a plurality of coefficients for said plurality of delay signals.

7. A reverberation imparting device as defined in claim 6 wherein said adjusting means is capable of changing reverberation characteristics by changing the read-out timing of data stored in said delay memory to proportionally change the time intervals between the delay signals which are read out.

8. A reverberation imparting device as defined in claim 4 wherein said group coefficient operation means comprises a low-pass filter.

9. A reverberation imparting device as defined in claim 4 wherein said group coefficient operation means comprises a digital filter.

10. A reverberation imparting device comprising:

a delay memory for receiving and storing successive input signal data samples and providing a plurality of delay signals corresponding to time intervals between writing and reading of the input signal data;

first addition means for receiving distinct groups of said delay signals and adding the delay signals within each group to provide a plurality of first addition signals;

control means for receiving the first addition signals and selectively and independently modifying each of the first addition signals; and second addition means for electrically adding said modified signals to provide a single reverberation signal.

11. A reverberation imparting device according to claim 10 wherein the control means includes coefficient operation means for imparting variable coefficients to the first addition signals.

12. A reverberation imparting device according to claim 10 wherein the control means includes variable filters for variably filtering the first addition signals.

* * * * *